United States Patent [19]

Borkar

[11] Patent Number: 5,063,308

[45] Date of Patent: *Nov. 5, 1991

[54] OUTPUT DRIVER WITH STATIC AND TRANSIENT PARTS

[75] Inventor: Shekhar Borkar, Portland, Oreg.

[73] Assignee: Intel Corporation, Santa Clara, Calif.

[ * ] Notice: The portion of the term of this patent subsequent to Dec. 4, 2007 has been disclaimed.

[21] Appl. No.: 463,406

[22] Filed: Jan. 11, 1990

Related U.S. Application Data

[62] Division of Ser. No. 287,915, Dec. 21, 1988, Pat. No. 4,975,598.

[51] Int. Cl.$^5$ .............................................. H03K 17/16
[52] U.S. Cl. ..................................... 307/443; 307/263; 307/448; 307/542; 307/572; 307/451
[58] Field of Search ............... 307/443, 448, 451, 452, 307/453, 542, 568, 310, 362, 584, 585, 263, 572

[56] References Cited

U.S. PATENT DOCUMENTS

| | | | |
|---|---|---|---|
| 4,638,187 | 1/1987 | Boler et al. | 307/451 |
| 4,749,882 | 6/1988 | Morgan | 307/451 |
| 4,777,389 | 8/1989 | Wu et al. | 307/451 |
| 4,785,203 | 11/1988 | Nakamura | 307/451 |
| 4,820,942 | 4/1989 | Chan | 307/443 |
| 4,829,199 | 5/1989 | Prater | 207/443 |
| 4,855,623 | 8/1989 | Flaherty | 307/451 |
| 4,857,770 | 8/1989 | Partovi et al. | 307/451 |
| 4,987,324 | 1/1991 | Wong et al. | 307/448 |

*Primary Examiner*—Stanley D. Miller
*Assistant Examiner*—Terry D. Cunningham
*Attorney, Agent, or Firm*—Blakely, Sokoloff, Taylor & Zafman

[57] ABSTRACT

An output driver for high performance integrated circuits divided into two parts: static and transient. The static part is used to maintain the DC level. The transient part is active only during logic 0 to 1 and 1 to 0 transitions and is used only to assist the static part during such transitions.

5 Claims, 2 Drawing Sheets

OUTPUT DRIVER WITH STATIC AND TRANSIENT PARTS

This is a divisional of U.S. Pat. application Ser. No. 287,915 filed Dec. 21, 1988.

FIELD OF THE INVENTION

The present invention relates to large scale integrated circuits and specifically, implementations of output drivers in such circuits.

BACKGROUND OF THE INVENTION

Output drivers, which are also called output buffers, of large scale integrated circuits ("chips")—when they switch—generate noise in the chip's power supply lines. As the performance of the output driver changes with temperature, process, and voltage, so does the noise. For a good design, the noise should be restricted to levels set by the circuit designer based upon the characteristics of the particular chips used in the design. This requires that the output driver have a steady performance. The present invention is directed to a new output driver design which includes circuitry to reduce the noise generated during transitions between logic states, i.e., 0 to 1 transitions and 1 to 0 transitions.

PRIOR ART DRIVER

A typical prior art output driver is shown in FIG. 1. The driver comprises a large P type transistor (PMOS), and a large N type transistor (NMOS). These large transistors are capable of driving a large external load. The transistors are broken down into multiple small transistors in parallel. FIG. 1 shows them as broken down into groups of three each, transistors 11a–11c (PMOS) and 13a–13c (NMOS). The gates of the transistors, however, are connected in series using resistors Rp. These resistors are formed by polysilicon interconnection layers. Usually such resistance is not desirable in chip circuitry, and chip designers tend to use designs which avoid this resistance. However, in the case of output drivers, the resistance is used at an advantage. The two driver transistors are each connected to an inverter 15 and 17, called pre-drivers. An internal input 18 generated by the chip drives the pre-drivers, the pre-drivers drive the drivers, and the drivers drive the external load by placing a signal on its corresponding pin or pad 19.

The pre-driver 17 of the P type driver has a large P transistor, and a small N transistor in it. Similarly, the N transistor pre-driver 15 has a small P and a large N transistor. When the input signal 18 makes a logic 0 to a logic 1 transition, the output of the driver makes a similar transition. However, the following chain of events take place in between. Assume the input to the pre-drivers 17 and 15 is a logic 1, so their P transistors are turned off, and their N transistors are turned on. The N transistor of the N pre-driver is larger than the N transistor of the P pre-driver, so the N driver's gate is discharged to 0 volts faster than the P transistor's gate. This ensures that the N driver is turned off faster. Now, since the P driver's gate is also being discharged (although more slowly), it starts conducting, and pulls the output node 19 to the power supply voltage 21, or logic 1. The resistors Rp delay switching of individual transistors of the driver, due to RC delay; where R is the resistance of the polysilicon interconnect, and C is the gate capacitance. Thus, the individual transistors 11a–11c and 13a–13c are gradually turned on/off. This reduces noise current spikes in the power supply, and subsequently reduces noise. Similarly, for a logic 1 to 0 transition, the N driver is active, and similar events take place.

Performance of the Prior Art Driver

Prior art output drivers are found to be adequate for most designs, and are an established and well understood way of designing an output driver. However, as higher performing chips are developed, the performance of prior art output drivers is severely limiting. For example, with new VLSI processes capable of high performance, it is necessary to reduce the resistances between the transistors of the output drivers. However, reducing such resistances results in higher noise. For a typical 50 pf driver, the results are tabulated in Table I.

TABLE I

| Temperature degrees C. | Supply Voltage volts | Lo to Hi delay nano-seconds | Hi to Lo delay nano-seconds | di/dt Power ma/ns | di/dt Ground ma/ns |
|---|---|---|---|---|---|
| 0 | 5.0 | 3.8 | 3.9 | 38 | 42 |
| 120 | 4.0 | 6.2 | 6.1 | 10 | 11 | where di/dt is the rate of change of current in milli-amps/nano-sec.

The results in Table I take into consideration changes in temperature, and supply voltage, but do not reflect changes in process. However, even without considering process variation, the delay changes from about 6 nano-seconds to about 4 nano-seconds when the temperature changes from 120° to 0° Celsius. If the driver is designed for the worst case of 120° C., then the design would have been acceptable since drivers speed up at low temperatures and thus have improved performance. However, the noise on the power supply lines also increase as the drivers speed up. Specifically, as shown in Table I, the rate of change of current (di/dt) also increases as the drivers speed up. This (di/dt) causes a voltage drop across the power supply bond-wires and pins due to the inductance of the bond-wires and pins. This voltage drop appears as noise on the signal and is given by:

$$V_{noise} = L \frac{di}{dt}$$

where L is the total inductance in the path. Typically more than one output driver is connected to a bond-wire and pin. Thus the noise voltage is multiplied by the number of drivers connected. For example, ten drivers would give 10*3*10=300 millivolts of noise at 120° C. (Inductance is about 3 nano-henries). The same design would give 1200 millivolts of noise at 0° C. Inasmuch as the TTL output level for logic low is 800 millivolts, a chip which works at 120° C. would fail to work with TTL logic at 0° C. Such a drastic change in noise is not acceptable for high performance chips.

A paper describing an on-chip process dependent control voltage source which regulates the charge/discharge rate of a series transistor in an output buffer is Gabara, Thompson "Ground Bounce Control In CMOS Integrated Circuits," ISSCC, Feb.17, 1988, digest pages 88–89. In particular, FIG. 1(b) illustrates a voltage controlled tri-stateable output buffer.

SUMMARY OF THE INVENTION

An output driver is an interface circuit which outputs a chip's internal digital signal to the external world via a pin or pinout. Since it drives the output pin of a chip, it is called an output driver. The internal circuitry of the chip offers a small capacitance as a load, compared to the capacitance offered b board traces and system interconnect wires. Thus, the drivers internal to a chip are relatively small, and easy to build. An output driver, on the other hand, must translate an internally generated signal (which has low drive capability) into an external signal, with high drive capability. Such a driver is usually large, performance critical, power hungry, noisy, and relatively difficult to build.

Output drivers are performance critical in that the internal signals must be output in a short time interval. Otherwise the overall performance of the chip is reduced. Also, they should be able to drive adequate loads. For example, an address driver capable of driving a 50 pf (Pico-farads) load can be used with only five memory chips, if the inputs of the memory chips offer a 10 pf load. To add more memory chips, another buffer chip to buffer the address which can drive more than five memories is needed. This adds extra delay in the signal propagation, increases system power consumption, requires extra board space, and thus limits the chip's usefulness.

Output drivers generate noise in the internal power supply rails of the chip. The noise is introduced as the output drivers switch concurrently from one logic state to the other. This surge of current in the power pins alleviate the supply voltage on the chip due to the inductance of the pins and the bond wires which connect package pins to the internal silicon chip. This sharp voltage surge in the power supply rails of the chip results in a noise glitch on the signal pin, a problem which will be even worse in future chips as their complexity grows, processes become faster, clock rates increase, and the number of drivers increase.

The invented driver is divided into two parts: static and transient. The static part, which is similar to a prior art driver, is used to maintain the DC level. The transient part is active only during logic 0 to 1 and 1 to 0 transitions and is used only to assist the static part in order to reduce the amount of noise generated during transitions.

DETAILED DESCRIPTION OF THE INVENTION

Figure 1:
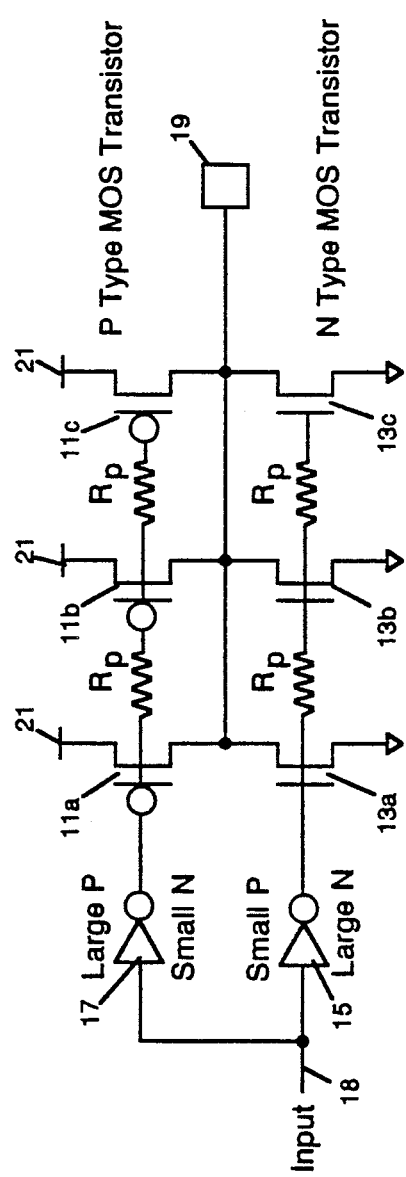
FIG. 1 is a schematic representation of a prior art output driver.
Figure 2:
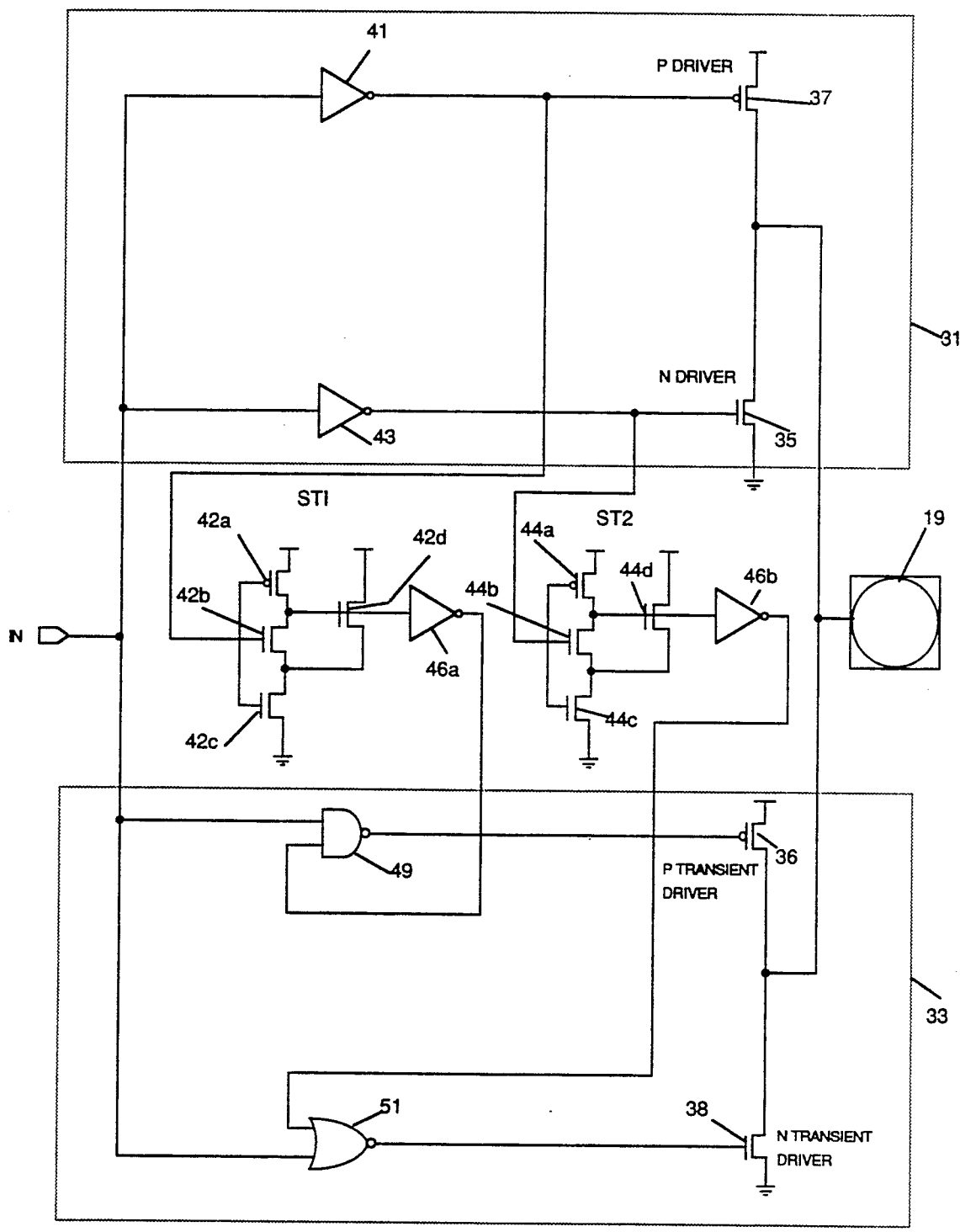
FIG. 2 is a schematic representation of a single output driver according to the present invention.

The invented output driver is shown in FIG. 2. The driver is divided into two parts: static 31, and transient 33. The static part is always active and comprises an N driver 35, a P driver 37 and predrivers 41 and 43; it maintains the voltage level at the output. If the output is logic 0, then the N driver 35 of the static part conducts, and provides current to maintain this level. When the output switches from logic 0 to logic 1, then the N driver 35 is turned off and the P driver 37 turns on. If the output is connected to a DC load, then the static driver transistors 35 and 37 source current to maintain the logic level. Since this part of the driver is always active, it is called static.

The transient part 33 is active only when the output makes a transition from one logic state to another; hence the name "transient." Output drivers switch a lot of current during a logic swing, and the transient part assists the static part. In this manner, maximum drive is obtained from both the parts when needed, so that the transient part can be gradually turned off. This controlled turn-off of the transient part helps reduce the rate of change of current (di/dt), and thus reduces the noise generated during logic state changes. Once the logic state is reached, the transient part is completely turned off, and the static part is strong enough to maintain the logic level.

As noted above, the static part comprises two driver transistors 35, and 37; and two pre-drivers (inverters) 41 and 43. N driver transistor 35 is turned on to switch output from logic 1 to logic 0. This is done by charging its gate to logic 1 (supply), then it conducts and discharges external load to 0 volts. Charging of the gate is accomplished by a P transistor in its pre-driver 13.

The transient part 33 is similar to the static part except, as mentioned above, it is active only during logic transitions, with transistors 36 and 38 functioning the same as transistors 37 and 35 respectively, although only during logic transitions. Unlike the prior art pre-drivers, the pre-drivers of the transient part of the subject invention are no longer simple inverters, but are replaced by NAND and NOR gates 49 and 51. The two structures, ST1 and ST2, are level detectors which are commonly called Schmitt Triggers. ST1 comprises transistors 42a–42c connected in serial, transistor 42d connected in parallel with transistors 42a and 42b, with the output of the transistors coupled to an inverter 46a. Similarly, ST2 comprises transistors 44a–44c connected in serial, transistor 44d connected in parallel with transistors 44a and 44b, with the output of the transistors coupled to an inverter 46b. ST1 and ST2 monitor voltage levels at the gate of the static driver transistors 37 and 35, respectively. Consider a logic 1 to 0 transition at the output 19. For that, both static and transient parts are active. During this transition, the gate of transistor 35 is steadily charging towards supply voltage. When the gate reaches a predetermined trip point (trigger point) of ST2, its output swings from logic 0 to logic 1. The trip point is usually set to approximately one-half the supply voltage. However, if it is anticipated that higher than usual levels of noise will be encountered, the trip point should be set higher than one-half supply voltage in order to avoid unintended compensation due to noise. When the output of ST2 swings to logic 1, NOR gate 51 is disabled in the transient part. The N driver transistor 38 of the transient part, whose gate was also charging towards supply voltage and assisting the static part, now starts becoming inactive and its gate starts discharging. Similarly, for a logic 0 to 1 transition at output 19, the gate of transistor 37 is steadily charging towards ground voltage. When the gate reaches the predetermined trip point (trigger point) of ST1, its output swings from logic 1 to logic 0. When the output of ST1 swings to logic 0, NAND gate 49 is disabled in the transient part. The P driver transistor 36 of the transient part, whose gate was also charging towards ground voltage and assisting the static part, now starts becoming inactive and its gate starts charging towards supply voltage.

In this manner, it is possible to design output drivers for less than worse case temperature, voltage and process and still be assured that the circuit will not fail due to excess noise generated during logic transitions. By designing for less than worse case conditions, it is possible to obtain better performance than is possible with prior art designs which must be designed taking worse case conditions into account.

I claim:

1. In a large scale integrated circuit formed by a predetermined process, said circuit including at least one output driver comprising:

static means coupled to a driver input of said output driver for generating an output of said output driver as a function of said driver input;

level detection means coupled to said static means for monitoring said static means and generating first and second signals indicating that said output is beginning to change from a first logic level to a second logic level and from said second logic level to said first logic level;

transient means coupled to said static means and said level detection means operating substantially only during transitions i) from said first logic level to said second logic level for assisting the output of said static means to reach the second logic level and ii) from said second logic level to said first logic level for assisting the output of said static means to reach the first logic level and thereby reduce a rate of change of current flowing through said output driver; wherein said static means comprises:

a P transistor driver coupled to an N transistor driver;

a first predriver having an input coupled to said driver input and having an output coupled to said P transistor driver and a second predriver having an input coupled to said driver input and having an output coupled to said N transistor driver.

2. The circuit defined by claim 1 wherein said level detection means comprises:

a first at least one transistor coupled to the output of said first predriver for generating said first signal for use by said transient means when said first predriver output reaches a predetermined trip point;

a second at least one transistor coupled to the output of said second predriver for generating said second signal for use by said transient means when said second predriver output reaches a predetermined trip point.

3. The circuit defined by claim 2 wherein the predetermined trip point of each of said first and second transistors is approximately one-half of a predetermined supply voltage that supplies power to said first and second transistors.

4. The circuit defined by claim 1 wherein said transient means comprises:

a P transistor transient driver coupled to an N transistor transient driver;

a first transient predriver having a first input coupled to said driver input and a second input for receiving said first signal and having an output coupled to said P transistor transient driver and a second transient predriver having a first input coupled to said driver input and a second input for receiving said second signal and having an output coupled to said N transistor transient driver.

5. The circuit defined by claim 4 wherein said first transient predriver is a NAND gate and said second transient predriver is a NOR gate.

* * * * *

UNITED STATES PATENT AND TRADEMARK OFFICE
CERTIFICATE OF CORRECTION

PATENT NO. : 5,063,308
DATED : November 5, 1991
INVENTOR(S) : Borkar It is certified that error appears in the above-identified patent and that said Letters Patent is hereby corrected as shown below:

| | | |
|---|---|---|
| col. 02, line 01 | delete "noise" | |
| col. 03, line 08, | delete "b" | insert --by-- |
| col. 04, line 22 | delete "13" | insert --43-- |

Signed and Sealed this

Twenty-second Day of March, 1994

*Attest:*

BRUCE LEHMAN

*Attesting Officer*     *Commissioner of Patents and Trademarks*